US 12,347,501 B2

(12) United States Patent
Deng et al.

(10) Patent No.: US 12,347,501 B2
(45) Date of Patent: Jul. 1, 2025

(54) METHOD OF PROGRAMMING MULTI-PLANE MEMORY DEVICE

(71) Applicant: YANGTZE MEMORY TECHNOLOGIES CO., LTD., Wuhan (CN)

(72) Inventors: Jialiang Deng, Wuhan (CN); Yu Wang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 18/227,505

(22) Filed: Jul. 28, 2023

(65) Prior Publication Data
US 2023/0368853 A1    Nov. 16, 2023

Related U.S. Application Data

(63) Continuation of application No. 17/412,255, filed on Aug. 26, 2021, now Pat. No. 11,776,641, which is a continuation of application No. 16/857,124, filed on Apr. 23, 2020, now Pat. No. 11,133,077, which is a continuation of application No. PCT/CN2020/075936, filed on Feb. 20, 2020.

(51) Int. Cl.
*G11C 11/34*    (2006.01)
*G11C 16/24*    (2006.01)
*G11C 16/26*    (2006.01)
*G11C 16/34*    (2006.01)

(52) U.S. Cl.
CPC .......... *G11C 16/3459* (2013.01); *G11C 16/24* (2013.01); *G11C 16/26* (2013.01)

(58) Field of Classification Search
CPC ....... G11C 7/1051; G11C 7/22; G11C 7/1072; G11C 7/1006; G11C 7/1066
USPC ........................................ 365/185.19, 185.22
See application file for complete search history.

(56) References Cited

U.S. PATENT DOCUMENTS

| 6,504,742 B1 | 1/2003 | Tran |
| 6,920,523 B2 | 7/2005 | Le |

(Continued)

FOREIGN PATENT DOCUMENTS

| CN | 102754164 A | 10/2012 |
| CN | 106067322 A | 11/2016 |

(Continued)

OTHER PUBLICATIONS

Extended European Search Report issued in corresponding European Application No. 24 15 2294, mailed on Apr. 4, 2024, 13 pages.

(Continued)

*Primary Examiner* — Son T Dinh
(74) *Attorney, Agent, or Firm* — BAYES PLLC (57) ABSTRACT

A memory device includes a plurality of planes. A method of programming the memory device includes applying a first program pulse to one or more memory cells of a first plane of the plurality of planes, verifying whether each one of the memory cells reaches a predetermined program state, and in response to a preset number of the memory cells in the first plane failing to reach the predetermined program state after the memory cells being verified for a predetermined number of times, bypassing the first plane when applying a second program pulse after the first program pulse.

20 Claims, 6 Drawing Sheets

(56) References Cited

U.S. PATENT DOCUMENTS

| | | | |
|---|---|---|---|
| 10,061,538 B2 | 8/2018 | Park et al. | |
| 10,134,474 B1 | 11/2018 | Chen | |
| 11,133,077 B2 | 9/2021 | Deng et al. | |
| 2006/0203548 A1 | 9/2006 | You | |
| 2012/0144120 A1 | 6/2012 | Serebrin | |
| 2013/0163335 A1 | 6/2013 | Kim et al. | |
| 2015/0043283 A1 | 2/2015 | Kwak et al. | |
| 2015/0262716 A1 | 9/2015 | Hendrickson | |
| 2016/0217860 A1* | 7/2016 | Lai | G11C 16/14 |
| 2016/0267987 A1 | 9/2016 | Hsieh | |
| 2017/0352430 A1 | 12/2017 | Chen et al. | |
| 2019/0066736 A1 | 2/2019 | Stichka et al. | |
| 2019/0096488 A1* | 3/2019 | Joe | G11C 16/3459 |
| 2020/0160914 A1 | 5/2020 | Yang | |

FOREIGN PATENT DOCUMENTS

| | | | |
|---|---|---|---|
| CN | 106469570 A | 3/2017 | |
| CN | 107562649 A | 1/2018 | |
| CN | 108122588 A | 6/2018 | |
| CN | 109509503 A | 3/2019 | |
| CN | 110400594 A | 11/2019 | |
| CN | 110619916 A | 12/2019 | |
| TW | I537964 B | 6/2016 | |

OTHER PUBLICATIONS

Anonymous: "Flash memory—Wikipedia", Jun. 26, 2018, XP093143263, retrieved from the Internet: URL: https://en.wikipedia.org/w/index.php?title=Flash_memory&oldid=876423585 [retrieved on Mar. 20, 2024], 23 pages.

* cited by examiner

METHOD OF PROGRAMMING MULTI-PLANE MEMORY DEVICE

CROSS REFERENCE TO RELATED APPLICATIONS

This application is a continuation of U.S. application Ser. No. 17/412,255, filed on Aug. 26, 2021, which is a continuation of U.S. application Ser. No. 16/857,124, filed on Apr. 23, 2020, which is a continuation of International Application No. PCT/CN2020/075936, filed on Feb. 20, 2020, all of which are incorporated herein by reference in their entireties.

BACKGROUND

The present disclosure relates to memory control, and in particular, to a method of programming a multi-plane memory device.

Non-volatile memory has been used extensively in personal computers, telecommunications, consumer electronics and other fields. Electrically erasable programmable read only memory (EEPROM) and flash memory are among the most widely employed non-volatile memory.

Memory devices may be classified into a single-plane type and a multi-plane type in accordance with the structural configuration of memory arrays. The single-plane type memory device includes memory arrays organized into a single plane, and the multi-plane type memory device includes memory arrays organized into a plurality of planes. When programming the multi-plane type memory device, two or more memory planes may be programmed simultaneously to enhance the programming efficiency. However, when the multi-plane type memory device contains defective memory planes, both the normal memory planes and defective memory planes will be repeatedly programmed in an attempt to program data into the defective memory planes, decreasing the programming speed, reducing the programming efficiency, and increasing program disturbance in the normal memory plane.

SUMMARY

According to one embodiment, a memory device includes a plurality of planes, a row driver and a controller. A method of programming the memory device includes in a program operation, the row driver applying a program pulse to a plurality of memory cells of a first plane of the plurality of planes; after the row driver applies the program pulse to the plurality of memory cells, the controller verifying if the plurality of memory cells have reached a predetermined program state; and if a preset number of the plurality of memory cells have failed to reach the predetermined program state after the plurality of memory cells have been verified for a predetermined number of times, the controller disabling the first plane.

These and other objectives of the present disclosure will no doubt become obvious to those of ordinary skill in the art after reading the following detailed description of the preferred embodiment that is illustrated in the various figures and drawings.

DETAILED DESCRIPTION

Although embodiments of the present disclosure will be described with reference to a 2-dimensional NAND flash device, it will be understood that embodiments of the present inventive concept are not limited thereto to this configuration but are also applicable to a 3-dimensional NAND flash memory device. In addition, the present disclosure is applicable to other nonvolatile memory devices, such as an electrically erasable and programmable read only memory (EEPROM), a NOR flash memory, a phase-change RAM (PRAM), a magnetic RAM (MRAM), a resistive RAM (RRAM), a ferroelectric RAM (FRAM), and the like, without departing from the scope of the present disclosure.

Figure 1:
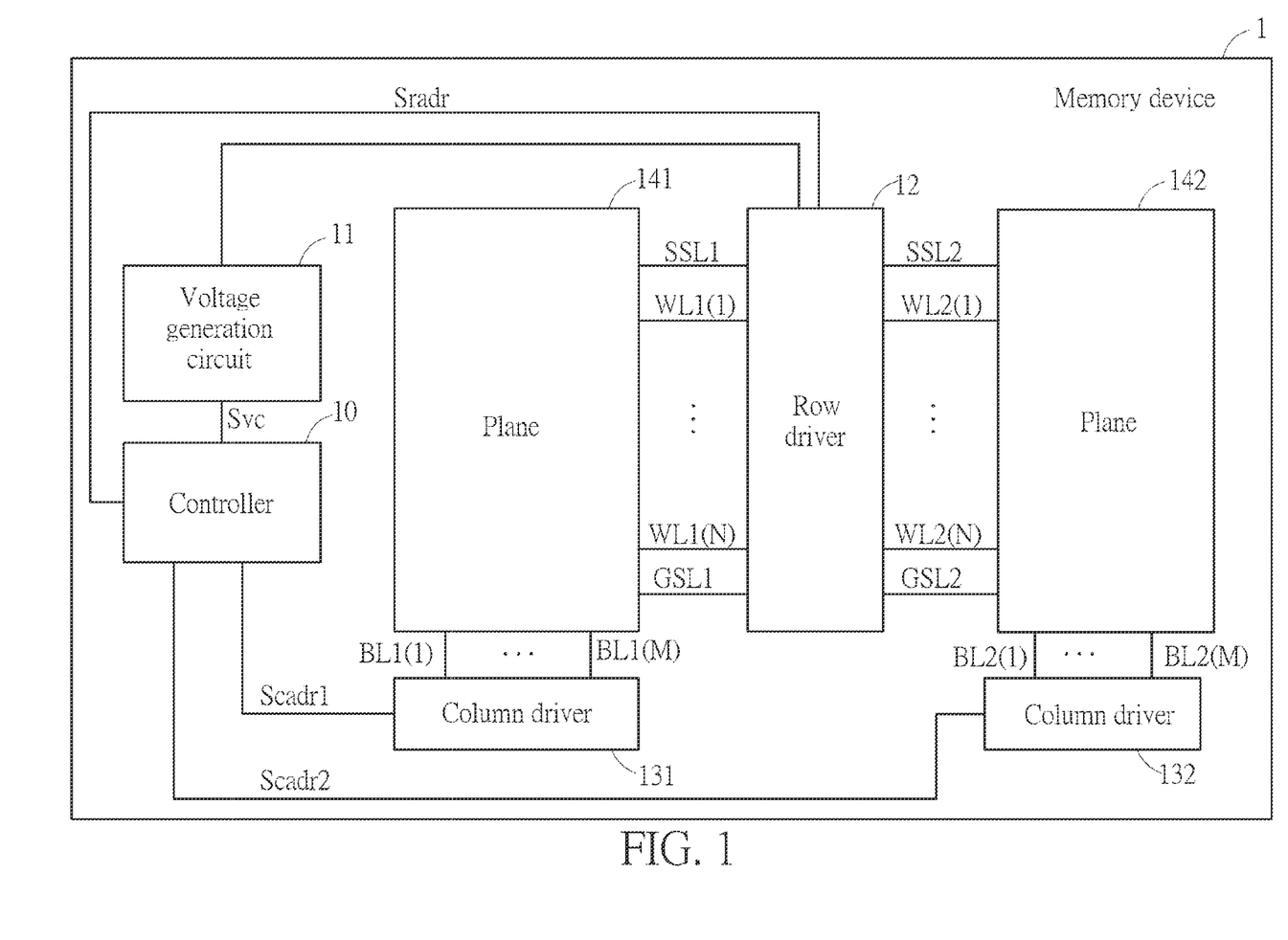
FIG. 1 is a block diagram of a memory device according to an embodiment of the disclosure.

FIG. 1 is a block diagram of a memory device 1 according to an embodiment of the present disclosure. The memory device 1 has a dual-plane structure, and may include a controller 10, a voltage generation circuit 11, a row decoder 12, column drivers 131, 132 and planes 141, 142. While the dual-plane structure is used in the embodiment, it should be appreciated that other numbers of planes may also be adopted within the scope of the present disclosure. The planes 141, 142 may be programmed simultaneously. After programming, if the plane 141 or the plane 142 is verified as failed for a predetermined number of times, the row driver 12 may disable the failed plane 141 or 142 from subsequent programming. The disablement of the failed plane reduces the time spent in an attempt to program the same, and reduce program disturbance in the operating plane.

The controller 10 may be coupled to the voltage generation circuit 11 and the column drivers 131, 132. The voltage generation circuit 11 may be coupled to the row driver 12. The row driver 12 may be coupled to the plane 141 via a string select line SSL1, word lines WL1(1) to WL1(N) and a ground select line GSL1, N being a positive integer, e.g., N=64. The row driver 12 may be coupled to the plane 142 via a string select line SSL2, word lines WL2(1) to WL2(N) and a ground select line GSL2. The column driver 131 may be coupled to the plane 141 via bit lines BL1(1) to BL1(M), M being a positive integer, e.g., M=8192. The column driver 132 may be coupled to the plane 142 via bit lines BL2(1) to BL2(M). Each of the planes 141, 142 may contain a plurality of blocks, each block may contain a plurality of pages, and each page may contain an array of memory cells. The array of memory cells in the plane 141 may be addressed by the word lines WL1(1) to WL1(N) and the bit lines BL1(1) to BL1(M), and the array of memory cells in the plane 142 may be addressed by the word lines WL2(1) to WL2(N) and the bit lines BL2(1) to BL2(M).

The controller 10 may communicate with an external host to receive data for storage in the planes 141, 142 and to transmit data fetched from the planes 141, 142. The controller 10 may receive commands, addresses or data from the external host and generate column address signals Scadr1, Scadr2, a row address signal Sradr and a voltage control signal Svc. The voltage generation circuit 11 may generate voltages for read, program, erasure and verification operations in response to the voltage control signal Svc from the controller 10. The voltages generated by the voltage generation circuit 11 may exceed a supply voltage provided to the memory device 1. The row driver 12 may operate in response to the row address signal Sradr from the controller 10 to select word lines for the read, program, erasure and verification operations. The column drivers 131, 132 may operate in response to the column address signals Scadr1, Scadr2 from the controller 10 to generate bit line signals to select bit lines for the read, program, erasure and verification operations. In the program operations, the voltage generation circuit 11 may generate a program voltage (e.g., 20V) and a program pass voltage (e.g., 10V) using the supply voltage (e.g., 3.3V), the row driver 12 may apply a program pulse having the magnitude of the program voltage to selected word lines, apply the program pass voltage to unselected word lines, apply the supply voltage to the string select lines SSL1, SSL2 and apply the ground voltage to the ground select lines GSL1, GSL2, and the column drivers 131, 132 may apply a ground voltage (e.g., 0V) to selected bit lines, and apply the supply voltage to unselected bit lines. In the verification operations, the voltage generation circuit 11 may generate an appropriate verification voltage, the row driver 12 may apply the appropriate verification voltage to selected word lines, apply the supply voltage to the string select lines SSL1, SSL2 and apply the supply voltage to the ground select lines GSL1, GSL2, and the column drivers 131, 132 may apply the ground voltage to unselected bit lines, and apply the supply voltage to selected bit lines of the planes 141, 142 to read data from selected memory cells on the selected bit lines, respectively. If data read is incorrect, the controller 10 may verify the selected memory cell as failed, and if data read is correct, the controller 10 may verify the selected memory cell as passed.

Figure 2:
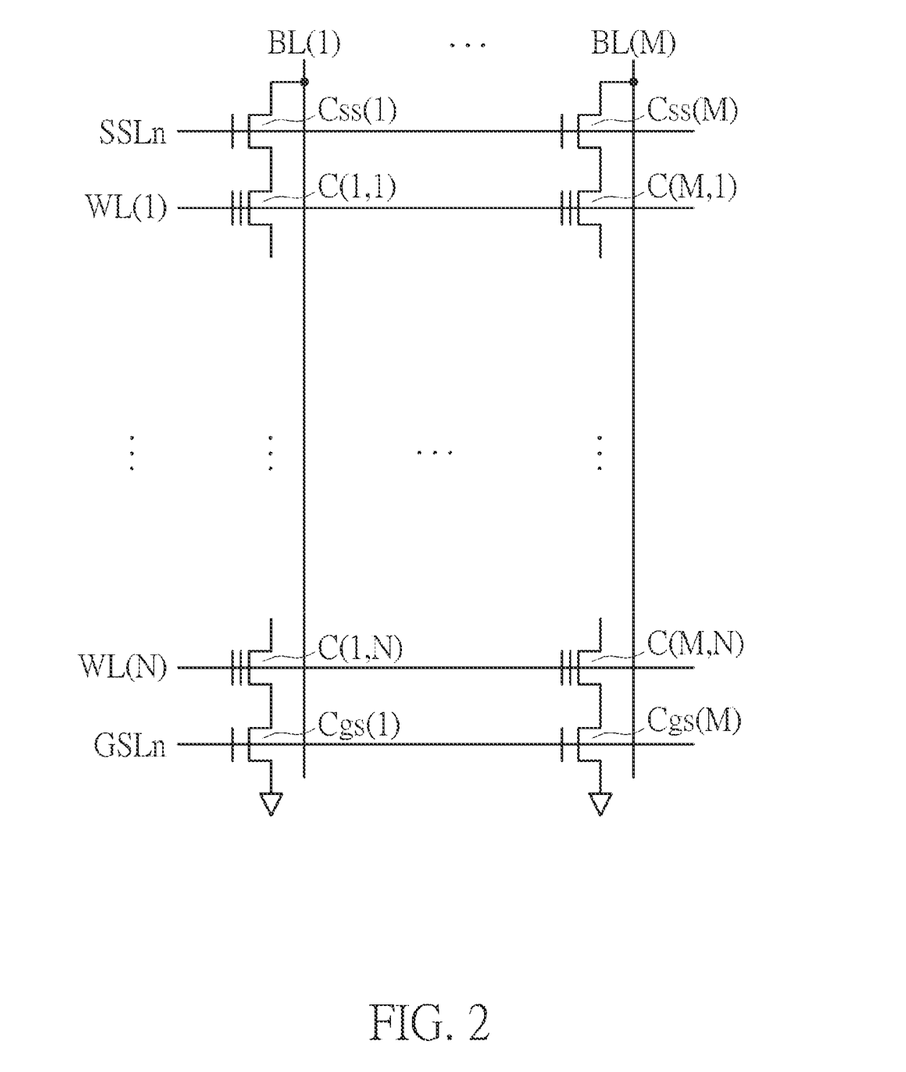
FIG. 2 is a schematic diagram of a page of memory cells of the planes in FIG. 1.

FIG. 2 is a schematic diagram of a page in the planes 141, 142. The page may include memory cells C(1,1) to C(M,N), string select cells Css(1) to Css(M) and ground select cells Cgs(1) to Cgs(M). The memory cells C(1,1) to C(M,N) may be floating-gate transistors or charge-trapping transistors, and each of the memory cells C(1,1) to C(M,N), the string select cells Css(1) to Css(M) and the ground select cells Cgs(1) to Cgs(M) may include a control terminal, a first terminal and a second terminal. A string select line SSLn may be coupled to the control terminals of the string select cells Css(1) to Css(M), and the bit lines BL(1) to BL(M) may be respectively coupled to the first terminals of the string select cells Css(1) to Css(M). The memory cells C(1,1) to C(M,N) may be arranged into rows of memory cells coupled to the respective word lines WL(1) to WL(N). The word lines WL(1) to WL(N) may be coupled to the control terminals of the memory cells C(1,1) to C(M,1) of the first row to the control terminals of the memory cells C(1,N) to C(M,N) of the Nth row, respectively, and the first terminals of the memory cells C(1,1) to C(M,1) may be respectively coupled to the second terminals of the string select cells Css(1) to Css(M). A ground select line GSLn may be coupled to the control terminals of the ground select cells Cgs(1) to Cgs(M), the first terminals of the ground select cells Cgs(1) to Cgs(M) may be respectively coupled to the second terminals of the memory cells C(1,N) to C(M,N), and the second terminals of the ground select cells Cgs(1) to Cgs(M) may be coupled to ground terminals. The ground terminals may provide the ground voltage.

The memory cells C(1,1) to C(M,N) may be of a single-level cell (SLC) type, a multi-level cell (MLC) type, a triple-level cell (TLC) type, a quad-level cell (QLC) type, a penta-level cell (PLC) type, or a higher-level type. Each memory cells C(m,n) may hold one of Q possible data states, where Q is a positive integer equal to or greater than 2, e.g., Q=2 for an SLC, Q=4 for an MLC, Q=8 for a TLC, Q=16 for a QLC, and Q=32 for a PLC. The Q possible data states may include an erase state S(0) and program states S(1) to S(Q-1), with the program state S(1) being the lowest program state and the program state S(Q-1) being the highest program state. In one example, a TLC may be programmed into one of 8 possible data states, with the program state S(1) being the lowest program state and the program state S(7) being the highest program state.

The memory cells C(1,1) to C(M,N) may be initially set in the erase state S(0), and later, a series of program-verification operations may be performed on the memory cells C(1,1) to C(M,N) to program the same into respective target program states. The series of program-verification operations may start from the lowest program state S(1) and proceed to higher program states until the threshold voltages of selected memory cells reach respective verification voltage levels of respective target program states. In some embodiments, the verification voltages may be selected as the minimum threshold voltages of threshold voltage distribution curves of the program states S(1) to S(Q-1), respectively. Each program-verification operation may include a program operation and a subsequent verification operation. In the program operation, some of the memory cells C(1,1) to C(M,N) may be selected and programmed into a program state in a row-by-row manner from the first row to the Nth row, or from the Nth row to the first row. In the subsequent verification operation, the controller 10 may verify whether the selected memory cells have reached the program states in the row-by-row manner from the first row to the Nth row, or from the Nth row to the first row. In this fashion, the memory cells C(1,1) to C(M,N) may be programmed into the respective target program states.

Figure 3:
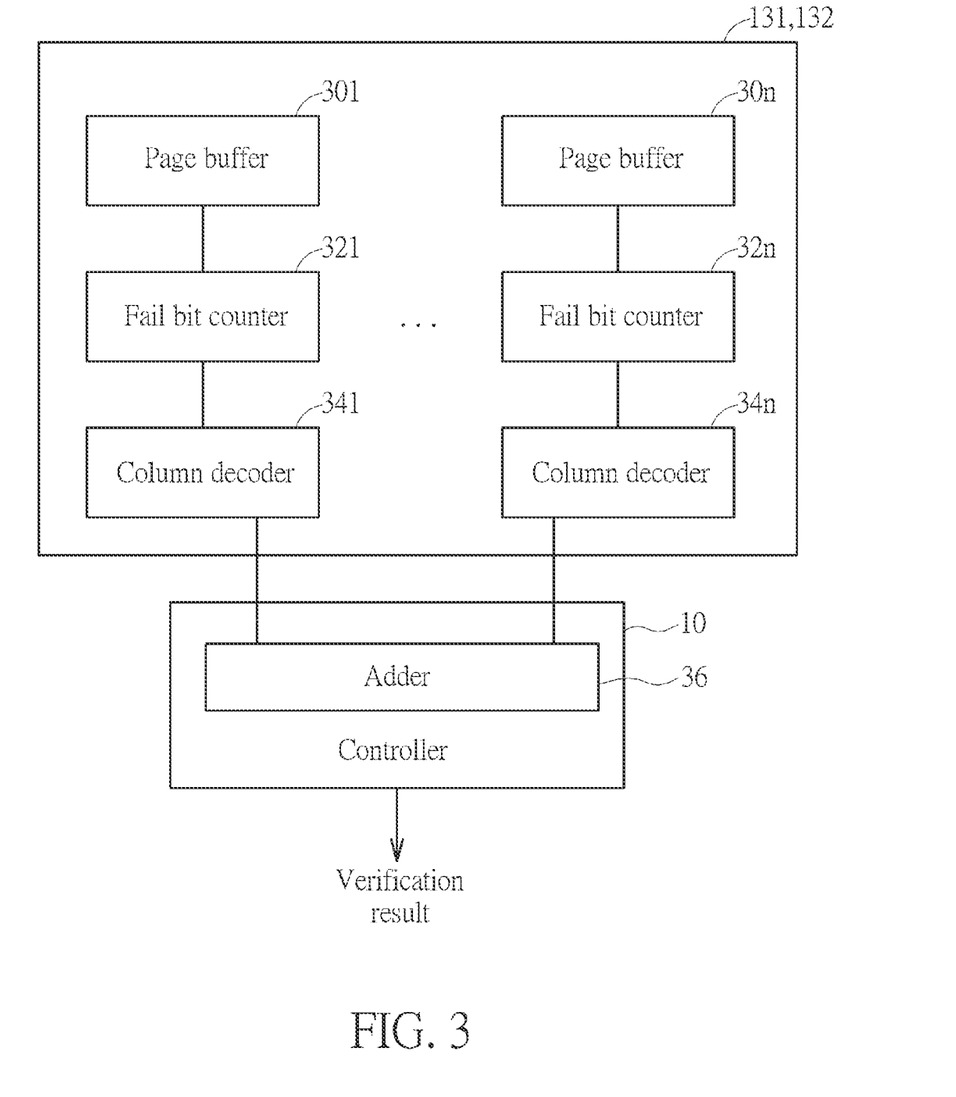
FIG. 3 is a block diagram of the column drivers and the controller in FIG. 1.

FIG. 3 is a block diagram of the column drivers 131, 132 and the controller 10. Each of the column drivers 131, 132 may include page buffers 301 to 30$n$, fail bit counters 321 to 32$n$ and column decoders 341 to 34$n$. The controller 10 may include an adder 36. In some embodiments, the column drivers 131, 132 may further include sense amplifiers to detect currents from the selected bit lines, thereby reading data from the planes 141, 142, respectively. The page buffers 301 to 30$n$ may be coupled to the fail bit counters 321 to 32$n$, respectively. The fail bit counters 321 to 32$n$ may be coupled to the column decoders 341 to 34$n$, respectively. The column decoders 341 to 34$n$ may be coupled to the adder 36. In some embodiments, the adder 36 may be located in each of the column drivers 131, 132, and may be coupled to the controller 10.

When verifying a program state S(q) of the planes 141, 142, the column decoders 341 to 34$n$ may receive column addresses in the column address signals Scadr1, Scadr2 to select bit lines of the planes 141, 142, so as to retrieve data from selected memory cells in the pages of the planes 141, 142 to the page buffers 301 to 30$n$, respectively. The fail bit counters 321 to 32$n$ may count the number of memory cells verified as failed in the pages of the planes 141, 142 to generate page fail bit counts, respectively. The adder 36 may accumulate page fail bit counts of all pages of the plane 141 to generate a first plane fail bit count, and accumulate page fail bit counts of all pages of the plane 142 to generate a second plane fail bit count. If the first plane fail bit count is less than a preset plane fail bit count, the controller 10 may verify the plane 141 as passed, and if the first plane fail bit count exceeds the preset plane fail bit count, the controller 10 may verify the plane 141 as failed. Similarly, if the second plane fail bit count is less than the preset plane fail bit count, the controller 10 may verify the plane 142 as passed, and if the second plane fail bit count exceeds the preset plane fail bit count, the controller 10 may verify the plane 142 as failed. When the planes 141, 142 are verified as failed for a predetermined number of times, e.g., 4 times, the controller 10 may disable the planes 141, 142. When the planes 141, 142 are verified as passed prior to being verified as failed for the predetermined number of times, the controller 10 may continue to program the planes 141, 142 into the next program state S(q+1).

When the plane 141 and/or the plane 142 is verified as passed, the controller 10 may generate a fail bit pass signal indicating a program pass, and when both the plane 141 and the plane 142 are verified as failed, the controller 10 may generate a fail bit pass signal indicating a program failure. The fail bit pass signal may be used to determine whether to continue to program the memory device 1. In some embodiments, the controller 10 may set the fail bit pass signal to the logical high to continue programming of the memory device 1, and set the fail bit pass signal to the logical low to cease programming of the memory device 1. In some embodiments, the controller 10 may further generate a status report indicating a program result upon exiting the program-verification operations. When at least one of the planes 141, 142 completes programming of the highest state S(Q−1), the status report may indicate a program pass. When both the planes 141, 142 are disabled prior to completion of programming of the highest state S(Q−1), the status report may indicate a program failure. When program pulses applied to the memory device 1 exceed a maximum program pulse count, the status report may indicate a program failure.

Figure 4:
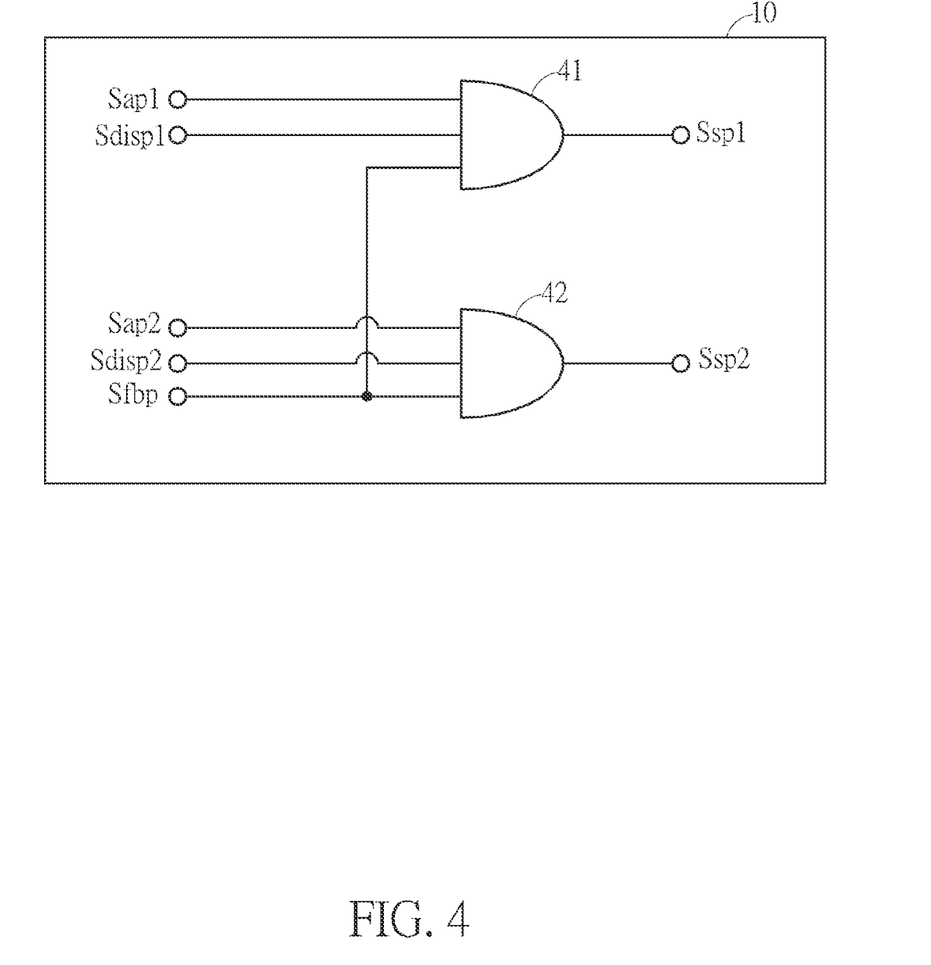
FIG. 4 is a schematic diagram of a selected circuit of the controller in FIG. 1.

FIG. 4 is a schematic diagram of a selected circuit in the controller 10. The controller 10 may include AND gates 41 and 42 to control access to the planes 141 and 142, respectively. The AND gate 41 may receive a plane address signal Sap1, a fail bit pass signal Sfbp and a plane disable signal Sdisp1 to generate a plane select signal Ssp1. The AND gate 42 may receive a plane address signal Sap2, the fail bit pass signal Sfbp and a plane disable signal Sdisp2 to generate a plane select signal Ssp2. The controller 10 may generate the column address signal Scadr1 according to the plane select signal Ssp1, generate the column address signal Scadr2 according to the plane select signal Ssp2, and generate the row address signal Sradr according to the plane select signals Ssp1, Ssp2. In some embodiments, when it is determined to disable the plane 141, the controller 10 may set the plane disable signal Sdisp1 a logical low, the AND gate 41 may block the plane select signal Ssp1 in response to the plane disable signal Sdisp1 by setting the plane select signal Ssp1 to the logical low, and the controller 10 may generate the row address signal Sradr and the column address signal Scadr1 to deselect the word lines WL1(1) to WL1(N) and the bit lines BL1(1) to BL1(M) of the plane 141. Likewise, when it is determined to disable the plane 142, the controller 10 may set the plane disable signal Sdisp2 to the logical low, the AND gate 42 may block the plane select signal Ssp2 in response to the plane disable signal Sdisp2 by setting the plane select signal Ssp2 to the logical low, and the controller 10 may generate the row address signal Sradr and the column address signal Scadr2 to deselect the word lines WL2(1) to WL2(N) and the bit lines BL2(1) to BL2(M) of the plane 142.

In some embodiments, the AND gate 41 may receive a first block address signal in place of the plane address signal Sap1 to generate a first block select signal, and the AND gate 42 may receive a second block address signal in place of the plane address signal Sap2 to generate a second block select signal. The controller 10 may generate the column address signal Scadr1 according to the first block select signal, generate the column address signal Scadr2 according to the second block select signal, and generate the row address signal Sradr according to the first block select signal and the second block select signal. In some embodiments, when it is determined to disable the plane 141, the controller 10 may set the plane disable signal Sdisp1 to the logical low, the AND gate 41 may block the first block select signal in response to the plane disable signal Sdisp1 by setting the first block select signal to the logical low, and the controller 10 may generate the row address signal Sradr and the column address signal Scadr1 to deselect the word lines WL1(1) to WL1(N) and the bit lines BL1(1) to BL1(M) of the plane 141. Likewise, when it is determined to disable the plane 142, the controller 10 may set the plane disable signal Sdisp2 to the logical low, the AND gate 42 may block the second block select signal in response to the plane disable signal Sdisp2 by setting the second block select signal to the logical low, and the controller 10 may generate the row address signal Sradr and the column address signal Scadr2 to deselect the word lines WL2(1) to WL2(N) and the bit lines BL2(1) to BL2(M) of the plane 142.

The controller 10 may employ a program state counter q, failed verification counts Cvf1, Cvf2 and a program pulse count Cp to generate the plane disable signals Sdisp1, Sdisp2 to control access to the planes 141, 142. The program state counter q may be a positive integer ranging between 1 and (Q−1). The failed verification counts Cvf1, Cvf2 may be positive integers ranging between 1 and a maximum failure count Cvmax(q). The maximum failure count Cvmax(q) may define the maximum number of times to perform verifications of a program state S(q) prior to disabling a plane, and may be specific to the program state S(q). For example, the program states S(1) to S(7) may be assigned maximum failure counts Cvmax(1) to Cvmax(7), respectively. The maximum failure count Cvmax(q) may be a positive integer greater than 1, and may be set during a manufacturing setup. The program pulse count Cp may be positive integers ranging between 1 and a maximum program pulse count Cpmax. The maximum program pulse count Cpmax may define the maximum number of times to apply program pulses to the planes 141, 142, and may be a positive integer greater than 1 and set during the manufacturing setup.

When the planes 141, 142 are verified as failed for the predetermined number of times as defined by the maximum failure count Cvmax(q), the controller 10 may disable the planes 141, 142 for the subsequent programming, thereby accelerating data programming and reducing program disturbance in the operating plane.

Figure 5:
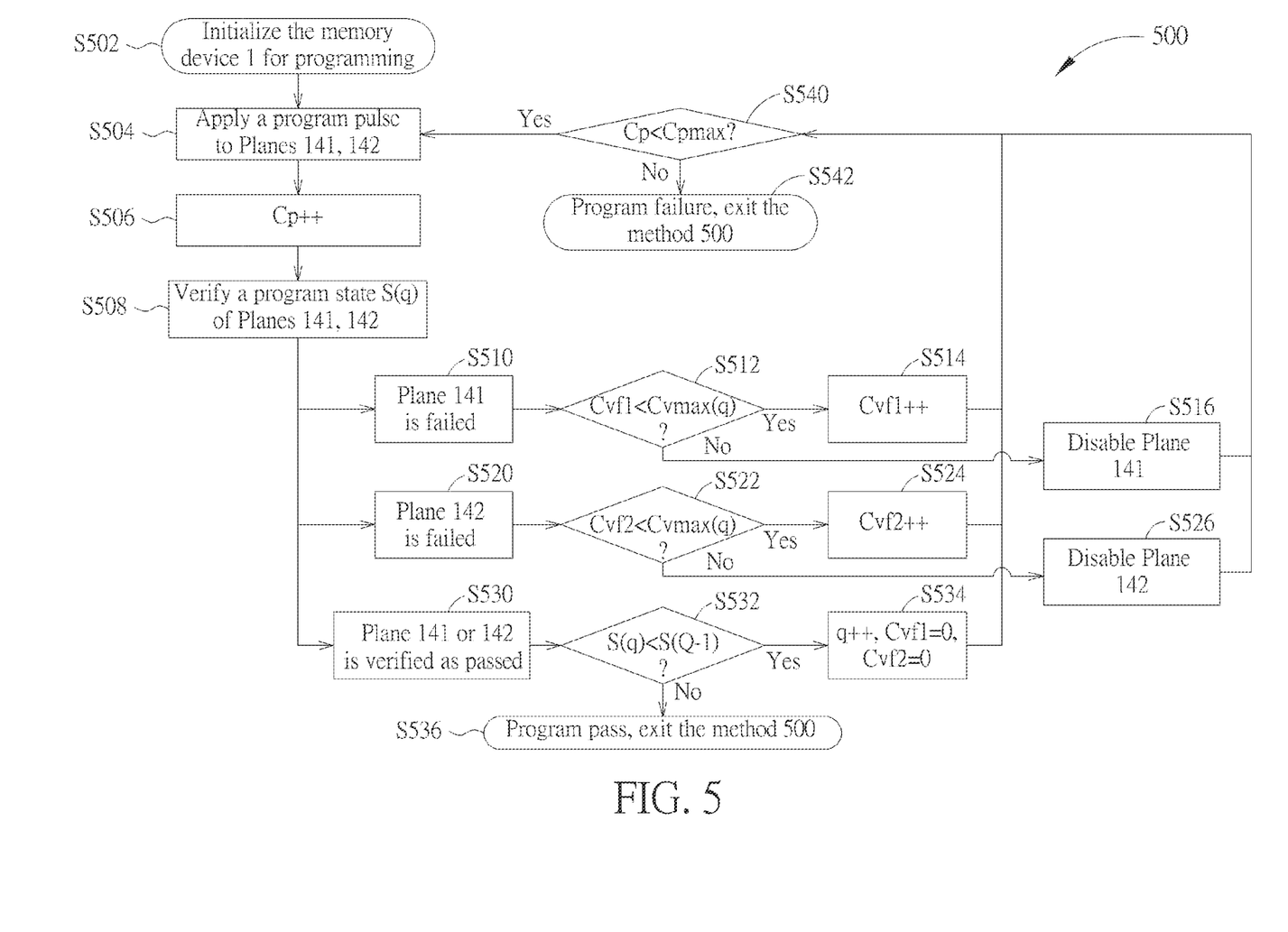
FIG. 5 is a flowchart of a method of programming the memory device in FIG. 1.

FIG. 5 is a flowchart of a method 500 of programming the memory device 1. The method 500 comprises Steps S502 to S542, performing multi-plane program on the planes 141, 142 and disabling the planes 141, 142 according to respective failed verification counts Cvf1, Cvf2 of the planes 141, 142. Steps S502 to S508 are used to program and verify the memory device 1. Steps S512 to S516 are used to determine whether to disable the plane 141. Steps S522 to S526 are used to determine whether to disable the plane 142. Steps S532 to S536 are used to complete programming of the program-enabled planes 141, 142. Steps S540 and S542 are used to disable programming of the memory device 1 according to a program pulse count Cp. Any reasonable step change or adjustment is within the scope of the disclosure. Steps S502 to S542 are explained as follows:

Step S502: The controller 10 resets the program pulse count Cp, the failed verification counts Cvf1, Cvf2 and the program state counter q;

Step S504: The row driver 12 applies a program pulse to the planes 141, 142;

Step S506: The controller 10 increments the program pulse count Cp;

Step S508: The controller 10 verifies a program state S(q) of the planes 141, 142;

Step S510: The controller 10 has verified the plane 141 as failed;

Step S512: The controller 10 determines whether the failed verification count Cvf1 is less than a maximum failure count Cvmax(q); If so, go to Step S514, and if not, go to Step S516;

Step S514: The controller 10 increments the failed verification count Cvf1; Go to Step S540;

Step S516: The controller 10 disables the plane 141; Go to Step S540;

Step S520: The controller 10 has verified the plane 142 as failed;

Step S522: The controller 10 determines that the failed verification count Cvf2 is less than the maximum failure count Cvmax(q); If so, go to Step S524, and if not, go to Step S526;

Step S524: The controller 10 increments the failed verification count Cvf2; Go to Step S540;

Step S526: The controller 10 disables the plane 142; Go to Step S540;

Step S530: The controller 10 has verified the planes 141 or 142 as passed;

Step S532: The controller 10 determines whether the program state S(q) is less than the highest program state S(Q-1)? If so, go to Step S534, and if not, go to Step S536;

Step S534: The controller 10 increments the program state S(q) and resets the failed verification counts Cvf1, Cvf2; Go to Step S540;

Step S536: The controller 10 generates the status report indicating a program pass; exit the method 500;

Step S540: The controller 10 determines whether the program pulse count Cp is less than the maximum program pulse count Cpmax; If so, go to Step S504, and if not, go to Step S542;

Step S542: The controller 10 generates the status report indicating a program failure; exit the method 500.

The method 500 may be exemplified using the memory device 1 and TLC memory cells to illustrate details of Steps. Upon startup of the multi-plane program, the planes 141, 142 are initialized for programming. The controller 10 sets the plane disable signals Sdisp1, Sdisp2 and the fail bit pass signal Sfbp to the logical high, and sets the program pulse count Cp, the failed verification counts Cvf1, Cvf2 to and the program state counter q (S502). In some embodiments, the program pulse count Cp and the failed verification counts Cvf1, Cvf2 may be reset to 0 (Cp=0, Cvf1=0, Cvf2=0), and the program state counter q may be reset to 1 (q=1). Next, the row driver 12 applies a program pulse to selected word lines of the planes 141, 142 (S504) and the controller 10 increments the program pulse count Cp by 1 (Cp=1) (S506). The controller 10 verifies if memory cells of the planes 141, 142 has reached the program state S(1) (S508). If more than a preset number of the memory cells of the planes 141, 142 have failed to reach the program state S(1), the controller 10 will verify the planes 141, 142 as failed. If less than the preset number of the memory cells of the planes 141, 142 have failed to reach the program state S(1), the controller 10 will verify the planes 141, 142 as passed.

If the controller 10 has verified the plane 141 as failed (S510), the controller 10 next determines whether the failed verification count Cvf1 is less than a maximum failure count Cvmax(1) of the program state S(1) (S512). In some embodiments, the maximum failure count Cvmax(1) may be 4. If the failed verification count Cvf1 (Cvf1=0) is less than a maximum failure count Cvmax(1) (Cvmax(1)=4), the controller 10 increments the failed verification count Cvf1 by 1 (Cvf1=1) (S514). In Step S540, the controller 10 determines whether the program pulse count Cp is less than the maximum program pulse count Cpmax. In some embodiments, the maximum program pulse count Cpmax may be 20. If the program pulse count Cp (Cp=1) is less than the maximum program pulse count Cpmax (Cpmax=20), the controller 10 iterates over Steps S504 to S514 and Step S540 until the plane 141 remains verified as failed when the failed verification count Cvf1 reaches 4. When the controller 10 determines that the failed verification count Cvf1 (Cvf1=4) is not less than a maximum failure count Cvmax(1) (Cvmax(1)=4), the controller 10 sets the plane disable signal Sdisp1 to the logical low while maintaining the fail bit pass signal Sfbp to the logical high to disable the plane 141 (S516).

Similarly, if the controller 10 has verified the plane 142 as failed (S520), the controller 10 next determines whether the failed verification count Cvf2 (Cvf2=0) is less than the maximum failure count Cvmax(1) (Cvmax(1)=4) of the program state S(1) (S522). If so, the controller 10 increments the failed verification count Cvf2 by 1 (Cvf2=1) (S524). In Step S540, the controller 10 determines whether the program pulse count Cp (Cp=1) is less than the maximum program pulse count Cpmax (Cpmax=20). If so, the controller 10 iterates over Steps S504 to S508, Steps S520 to S524 and Step S540 until the plane 142 remains verified as failed when the failed verification count Cvf2 reaches 4. When the controller 10 determines that the failed verification count Cvf2 (Cvf2=4) is not less than a maximum failure count Cvmax(1) (Cvmax(1)=4), the controller 10 sets the plane disable signal Sdisp2 to the logical low while maintaining the fail bit pass signal Sfbp to the logical high to disable the plane 142 (S526).

If the controller 10 has verified both the planes 141, 142 as passed prior to the respective failed verification counts Cvf1, Cvf2 reaching the maximum failure count Cvmax(1), or verified one of the planes 141, 142 as passed prior to the respective failed verification counts Cvf1, Cvf2 reaching the maximum failure count Cvmax(1) and disabled the other one of the planes 141, 142 (S530), the controller 10 next determines whether the program state S(1) is less than the highest program state S(7) (S532). For example, the controller 10 may verify the plane 141 as passed and the plane 142 as failed upon applying the fourth program pulse (Cp=4, Cvf1=3, Cvf2=4), disable the plane 142 (S526) and proceed to program the plane 141 into the next program state S(2). If the program state S(1) is less than the highest program state S(7), the controller 10 increments the program state counter q by 1 (q=2) and resets the failed verification counts Cvf1, Cvf2 to 0 (Cvf1=0, Cvf2=0) (S534), and determines whether the program pulse count Cp (Cp=4) is less than the maximum program pulse count Cpmax (Cpmax=20) (S540). If so, since the plane 142 has been disabled, the controller 10 iterates over S504 to S514, Steps S530 to S534, and Step S540 until the plane 141 is disabled, the highest program state S(7) is reached, or the program pulse count Cp reaches the maximum program pulse count Cpmax. When both the plane 141 and the plane 142 are disabled, the controller 10 sets the plane disable signal Sdisp1 and the fail bit pass signal Sfbp to the logical low, generates a status report indicating that a program failure and exits the method 500 (S516). When the highest program state S(7) is reached, the controller 10 generates the status report indicating that a program pass and exits the method 500 (S536). When the program pulse count Cp (Cp=20) reaches the maximum program pulse count Cpmax (Cpmax=20), the controller 10 sets the fail bit pass signal Sfbp to the logic low, generates the status report indicating that a program failure and exits the method 500 (S542).

In Steps S512 and S522, the maximum failure count Cvmax(q) may be identical to or different from other maximum failure counts Cvmax(1) to Cvmax(q−1), Cvmax(q+1) to Cvmax(Q−1). For example, two or more of the maximum failure counts Cvmax(1) to Cvmax(7) may be identical, e.g., Cvmax(1)=Cvmax(2)= . . . =Cvmax(7)=4. In other embodiments, two or more of the maximum failure counts Cvmax (1) to Cvmax(7) may be different, e.g., Cvmax(1)=4 and Cvmax(2)=3.

In Steps S516 and S526, the plane disable signals Sdisp1, Sdisp2 are set to the logical low to set the plane select signals Ssp1, Ssp2 to the logical low, set the first block select signal or the second block select signal to the logical low, or set other signals controlling the word lines WL1(1) to WL1(N), WL2(1) to WL2(N), the bit lines BL1(1) to BL1(M), BL2(1) to BL2(M), the string select lines SSL1, SSL2, and the ground select lines GSL1, GSL2 to the logical low. When one of the planes 141, 142 is verified as passed, the fail bit pass signal Sfbp may be set to the logical high to continue programming of the memory device 1.

The method 500 is used to identify a failed plane upon verifying the plane as failed for a predetermined number of times, and disable the failed plane while continuing to program the operating plane, thereby accelerating data programming and reducing program disturbance in the operating plane.

Figure 6:
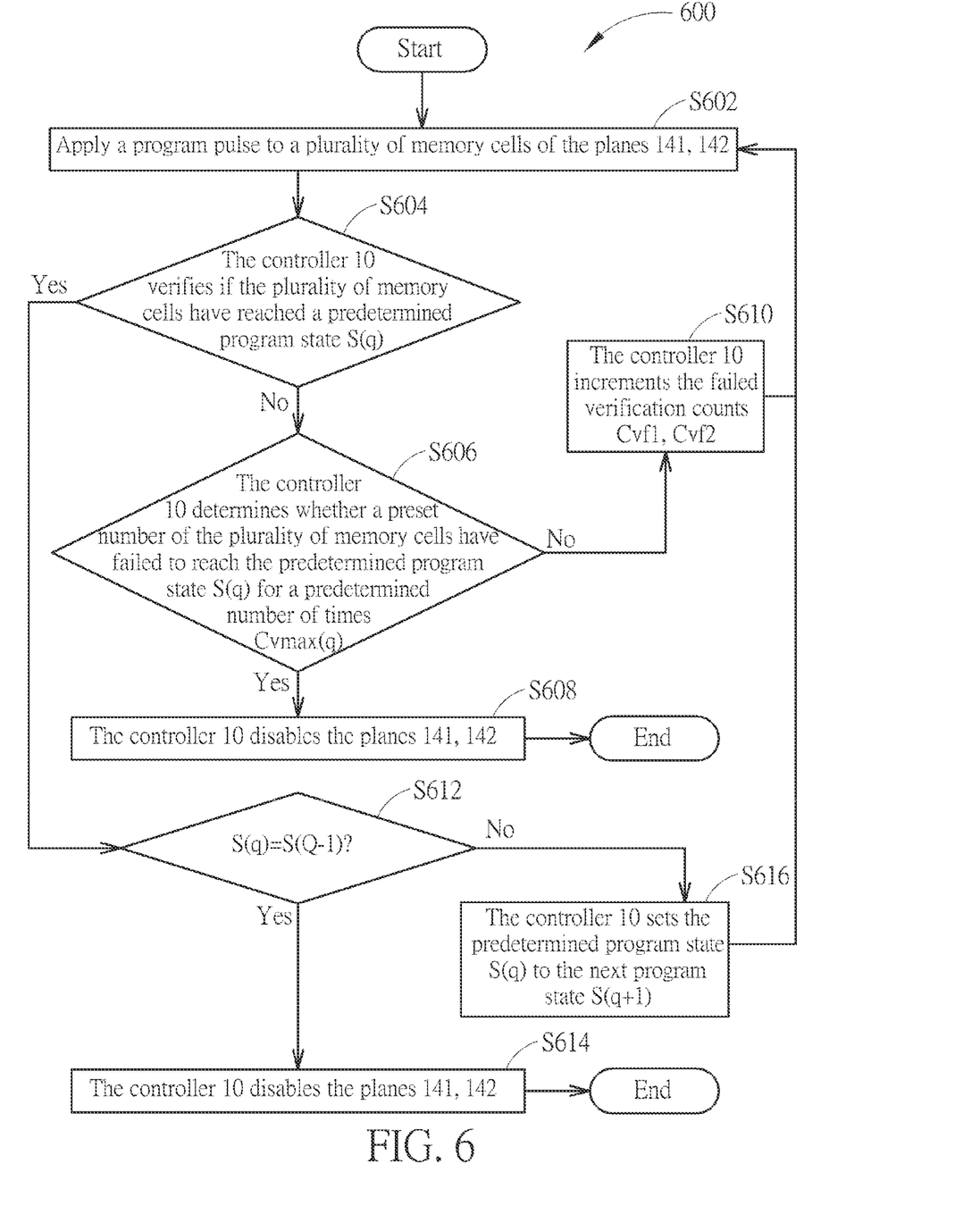
FIG. 6 is a flowchart of another method of programming the memory device in FIG. 1.

FIG. 6 is a flowchart of a method 600 of programming the memory device 1. The method 600 comprises Steps S602 to S616, disabling the planes 141, 142 according to respective failed verification counts Cvf1, Cvf2 of the plane 141/142. Steps S602 and S604 are used to program and verify the memory device 1. Steps S606 to S610 are used to determine whether to disable the plane 141/142. Steps S612 to S616 are used to continue to complete programming of the program-enabled planes 141, 142. Any reasonable step change or adjustment is within the scope of the disclosure. Steps S602 to S616 are explained as follows:

Step S602: The row driver 12 applies a program pulse to a plurality of memory cells of the planes 141, 142;

Step S604: The controller 10 verifies if the plurality of memory cells have reached a predetermined program state S(q); if so, go to Step S612, and if not, go to Step S606;

Step S606: The controller 10 determines whether a preset number of the plurality of memory cells have failed to reach the predetermined program state S(q) for a predetermined number of times Cvmax(q); if so, go to Step S608, and if not, go to Step S610;

Step S608: The controller 10 disables the planes 141, 142; exit the method 600.

Step S610: The controller 10 increments the failed verification counts Cvf1, Cvf2; go to Step S602;

Step S612: The controller 10 determines whether the predetermined program state S(q) is the highest program state S(Q−1)? if so, go to Step S614, and if not, go to Step S616;

Step S614: The controller 10 disables the planes 141, 142; exit the method 600.

Step S616: The controller 10 sets the predetermined program state S(q) to the next program state S(q+1); go to Step S602.

The explanation for Steps S602 to S616 have been provided in the preceding paragraphs and will not be repeated here. In the method 600, when the planes 141, 142 are verified as failed for the predetermined number of times, the controller 10 may disable the failed planes 141, 142 for the subsequent programming, thereby accelerating data programming and reducing program disturbance in the operating plane.

Those skilled in the art will readily observe that numerous modifications and alterations of the device and method may be made while retaining the teachings of the present disclosure. Accordingly, the above disclosure should be construed as limited only by the metes and bounds of the appended claims.

What is claimed is:

1. A method of programming a memory device, the memory device comprising planes, the method comprising:
   applying a first program pulse to a first plane of the planes;
   verifying whether the first plane reaches a predetermined program state; and
   in response to determining that the first plane has not been verified successfully yet after the first plane being verified for a predetermined number of times, bypassing the first plane when applying a second program pulse after the first program pulse.

2. The method of claim 1, further comprising:
   during applying the first program pulse to the first plane of the planes, applying the first program pulse to a second plane of the planes.

3. The method of claim 2, further comprising:
   applying the second program pulse to the second plane.

4. The method of claim 1, further comprising:
   incrementing a failed verification count in response to determining that the planes have not been programmed successfully yet.

5. The method of claim 1, wherein predetermined numbers of times associated with failed verifications of the predetermined program state and another program state are identical.

6. The method of claim 1, wherein predetermined numbers of times associated with failed verifications of the predetermined program state and another program state are different.

7. The method of claim 1, wherein bypassing the first plane comprises:
   blocking a plane select signal.

8. The method of claim 1, wherein bypassing the first plane comprises:
   blocking a block select signal.

9. The method of claim 1, wherein bypassing the first plane comprises:
   deselecting all word lines of the first plane.

10. The method of claim 1, wherein bypassing the first plane comprises:
    deselecting all bit lines of the first plane.

11. The method of claim 1, wherein bypassing the first plane comprises:
setting a fail bit count pass signal.

12. The method of claim 1, further comprising:
setting the predetermined program state to a next program state in response to one of the planes passing a verification of the predetermined program state and the predetermined program state not being a highest program state.

13. The method of claim 1, further comprising:
bypassing the planes in response to one of the planes passing verifications of the predetermined program state and the predetermined program state being a highest program state.

14. A memory device, comprising:
planes; and
a peripheral circuit coupled to the planes and configured to:
apply a first program pulse to a first plane of the planes;
verify whether the first plane reaches a predetermined program state; and
in response to determining that the first plane has not been verified successfully yet after the first plane is verified for a predetermined number of times, bypass the first plane when applying a second program pulse after the first program pulse.

15. The memory device of claim 14, wherein the peripheral circuit is further configured to:
during applying the first program pulse to the first plane of the planes, apply the first program pulse to a second plane of the planes.

16. The memory device of claim 15 wherein the peripheral circuit is further configured to:
apply the second program pulse to the second plane.

17. The memory device of claim 14, wherein the peripheral circuit comprises a controller, a column driver coupled to the controller, a row driver coupled to the controller, and a voltage generation circuit coupled to the controller.

18. A method of programming a memory device, the memory device comprising a first plane and a second plane, the method comprising:
simultaneously performing a first programming of the first plane and the second plane;
in response to the first programming of the first plane being failed, disabling a second programming of the first plane that follows after the first programming; and
in response to the first programming of the second plane being passed, enabling a second programming of the second plane that follows after the first programming.

19. The method of claim 18, further comprising:
verifying whether each of the first plane and the second plane reaches a predetermined program state.

20. The method of claim 18, disabling the programming of the first plane comprises at least one of:
blocking a plane selection signal;
blocking a block selection signal;
deselecting all word lines of the first plane; or
deselecting all bit lines of the first plane.

* * * * *